United States Patent [19]

Miyago et al.

[11] Patent Number: 5,036,370
[45] Date of Patent: Jul. 30, 1991

[54] THIN FILM SEMICONDUCTOR ARRAY DEVICE

[75] Inventors: Makoto Miyago, Higashiosaka; Hiroshi Oka, Shiki; Akihiko Imaya, Nara; Hiroaki Kato, Nara; Takayoshi Nagayasu, Nara; Toshihiko Hirobe, Sakai, all of Japan

[73] Assignee: Sharp Kabushiki Kaisha, Japan

[21] Appl. No.: 545,955

[22] Filed: Jul. 2, 1990

[30] Foreign Application Priority Data

Jul. 4, 1989 [JP] Japan ................... 1-173783

[51] Int. Cl.$^5$ ............... H01L 27/12; H01L 27/01; H01L 29/78; H01L 23/48
[52] U.S. Cl. ........................ 357/4; 357/23.7; 357/23.15; 357/71
[58] Field of Search ............... 357/4, 23.7, 23.1, 71, 357/23.15

[56] References Cited

U.S. PATENT DOCUMENTS 4,776,673 10/1988 Aoki et al. ................... 357/4
4,905,066 2/1990 Dohjo et al. .................. 357/23.7

FOREIGN PATENT DOCUMENTS 62-80626 4/1987 Japan .

Primary Examiner—Mark Prenty
Attorney, Agent, or Firm—Nixon & Vanderhye

[57] ABSTRACT

The production of a thin film transistor array device having a gate wiring on an insulated substrate. The gate wiring has an inner gate wiring having a first metal layer formed on the insulated substrate and a second metal layer whose etching speed is faster than that of the first metal layer, the first metal layer and the second metal layer being overlapped so as to constitute a dual structure, and an outer gate wiring covering the inner gate wiring.

3 Claims, 4 Drawing Sheets

THIN FILM SEMICONDUCTOR ARRAY DEVICE

BACKGROUND OF THE INVENTION

1. Field of the Invention:

The present invention relates to a transistor array device, and a method for producing the same. More particularly, the present invention relates to a thin film transistor array device adapted for use in large-screen active matrix display devices and a method for producing the same. Hereinafter, the thin film transistor will be referred to as "TFT".

2. Description of the Prior Art

Liquid crystal display devices which employ an active matrix system having a TFT array formed on an insulated substrate so as to drive picture element electrodes through the TFT are well known. The active matrix system has an advantage in that it can be applied to display devices designed to display on a large-scale screen with high density, whether the display is to be a reflecting type or a permeating type.

To obtain the TFT arrays, amorphous silicone (hereinafter referred to as "a-Si") or polycrystalline silicone is used as semiconductor material. FIG. 4 shows a conventional TFT array in which the rim of the layered portions is hatched with the central portion remaining unhatched for simplicity.

Referring to FIG. 5, the conventional fabrication of a TFT array device will be described:

Tantalum (Ta) is deposited on a glass substrate 21 by a spattering method to a thickness of 3,000 to 4,000 Å, and gate wirings 23 are formed in patterns by a photolithography or by an etching method. The gate wirings 23 can be formed by a lift-off method. A wider portion of the gate wiring 23 functions as a gate electrode 22. The surfaces of the gate electrode 22 and the gate wirings 23 are anodized so as to form an anodized film 24 which functions as a gate insulator film.

Subsequently, the anodized glass substrate 21 is covered with a gate insulating film 25, to the thickness of 2,000 to 4,000 Å containing silicon nitride (hereinafter referred to as "SiNx") by a plasma activated chemical vapor deposition method (hereinafter referred to as plasma CVD method).

The gate insulator film 25 is covered with an a-Si(i) layer (150 to 1,000 Å thick) and then with a SiNx layer (100 to 2,000 Å thick). The a-Si layer later becomes a semiconductor layer 26, and the SiNx layer later becomes an insulator layer 27. Subsequently, the SiNx layer is formed in a desired pattern, and an insulator layer 27 is formed on a portion of the gate electrode 22 except for the outer part thereof.

The insulator layer 27 on the glass substrate 21 is covered with an a-Si(n+) layer (300 to 2,000 Å thick) doped with phosphorus, which layer becomes a contact layer 28 by a plasma CVD. Finally, the a-Si(i) layer and the a-Si(n+) layer are formed in a desired pattern to form the semiconductor layer 26, and the contact layer 28 which is continuous on the insulator layer 27 at this stage.

A metal film of Mo, Ti, Al or the like is formed to the thickness of 2,000 to 10,000 Å on the glass substrate 21 so as to cover the semiconductor layer 26 and the contact layer 28, and the metal film is formed in pattern by etching so that a source electrode 29, a source bus 30 and a drain electrode 31 are formed. In this way a TFT is formed. The contact layer 28 is also subjected to the etching on insulator layer 27, thereby separating into a first portion under the source electrode 29 and a second portion under the drain electrode 31. Finally, the source electrode 29, the source bus 30 and the drain electrode 31 are entirely covered with an indium tin oxide (ITO) film by spattering. The ITO film is formed in a desired pattern to form a picture element electrode 32.

Such TFTs are formed in plurality on the gate wiring 23 to form the TFT array. The source bus 30 is perpendicular to the extension of the gate wiring 23, and is connected to the respective source electrodes 29 of the TFTs.

In the active matrix display device employing the TFT arrays the scanning signals are consecutively input to the gate wiring 23, and picture element signals are input to the source bus 30 to drive the picture element electrode 32. The gate wiring 23 and the source bus 30 have 307,200 junctions in a display device having picture elements of 480×640. If leak occurs at one of these picture elements between the gate wiring 23 and the source bus 30, a cross-type line failure occurs. This line failure spoils the quality of the image, and reduces the efficiency of the display device.

In the known display device described above, Ta is used for the gate wiring 23 because of its capability of being coated with an anodized film 24 whereby the gate wiring 23 and the source bus 30 are insulated. When the gate wiring 23 is made of Ta, an advantage is that the gate wiring 23 has a smooth tapered side, which prevents the source bus 30 from breakage at its junctions.

On the other hand, a disadvantage is that in a large-scale display device having a long gate wiring 23, the scanning signals attenuate because of Ta having a large specific resistance. As a result, the brightness of picture elements are different between two points adjacent to the input section of the signals and remote from the input section, thereby resulting in the detrimental brightness gradient in picture elements spreading from the input section.

In order to solve such problems, one proposal shown in FIG. 6 is that the gate wiring has a dual layer structure, that is, an inner gate wiring 33 of metal having low specific resistance such as Al, Al-Si, or Al-Si-Cu, and an outer gate wiring 34 of the Ta. The advantage of this structure is that the inner gate wiring 33 avoids the undesired production of brightness gradient.

To prevent leaks from occurring at a junction by use of gate wirings 23 having the dual layer structure, it is essential to completely cover the inner gate wiring 33 with the outer gate wiring 34. This is because in the process of forming the outer gate wiring 34 of Ta in pattern by etching, the etching speed of Al and other metals is higher than the etching speed of Ta. However, the inner gate wiring 33 of Al, Al-Si, or Al-Si-Cu cannot be formed so as to have a smooth inclined side. The rough sides are likely to cause the outer gate wiring 34 overlaying the inner gate wiring 33 to break. If the outer gate wiring 34 is broken in this way, the coverage of the inner gate wiring 33 fails. In addition, in the process of removing the resist after the inner gate wiring 33 is formed, the inner gate wiring 33 is liable to hillocks and voids. If the killocks and voids occur on the inner gate wiring 33, its complete coverage becomes impossible. This causes leaks between the gate wiring 23 and the source bus 30 regardless of the existence of a gate insulating film 25.

SUMMARY OF THE INVENTION

The transistor array device of the present invention, which overcomes the above-discussed and numerous other disadvantages and deficiencies of the prior art, comprises a gate wiring on an insulated substrate, the gate wiring comprising an inner gate wiring having a first metal layer formed on the insulated substrate and a second metal layer whose etching speed is faster than that of the first metal layer, the first metal layer and the second metal layer being overlapped so as to constitute a dual structure, and an outer gate wiring covering the inner gate wiring.

In a preferred embodiment, the inner gate wiring has a smaller specific resistance than that of the outer gate wiring.

In another preferred embodiment, the outer gate wiring is covered with an anodizing film.

According to another aspect of the present invention, there is provided a process for constructing a thin film transistor array device having a gate wiring on an insulated substrate, the process comprising the steps of overlapping a first metal layer over a second metal layer whose etching speed is faster than that of the first metal layer, forming an inner gate wiring in pattern on the first and second metal layers, and covering the inner gate wiring with an outer gate wiring.

In a preferred embodiment, the process further comprises a step of forming an anodized film on the outer gate wiring.

Thus, the invention described herein achieves the objects of (1) providing a thin film transistor array device having a gate wiring capable of anodizing, thereby reducing the specific resistance of the gate wiring, and (2) providing a thin film transistor array device capable of enhancing the image quality when it is applied to a large-screen display, thereby, increasing the efficiency of the display device and reducing the production cost.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
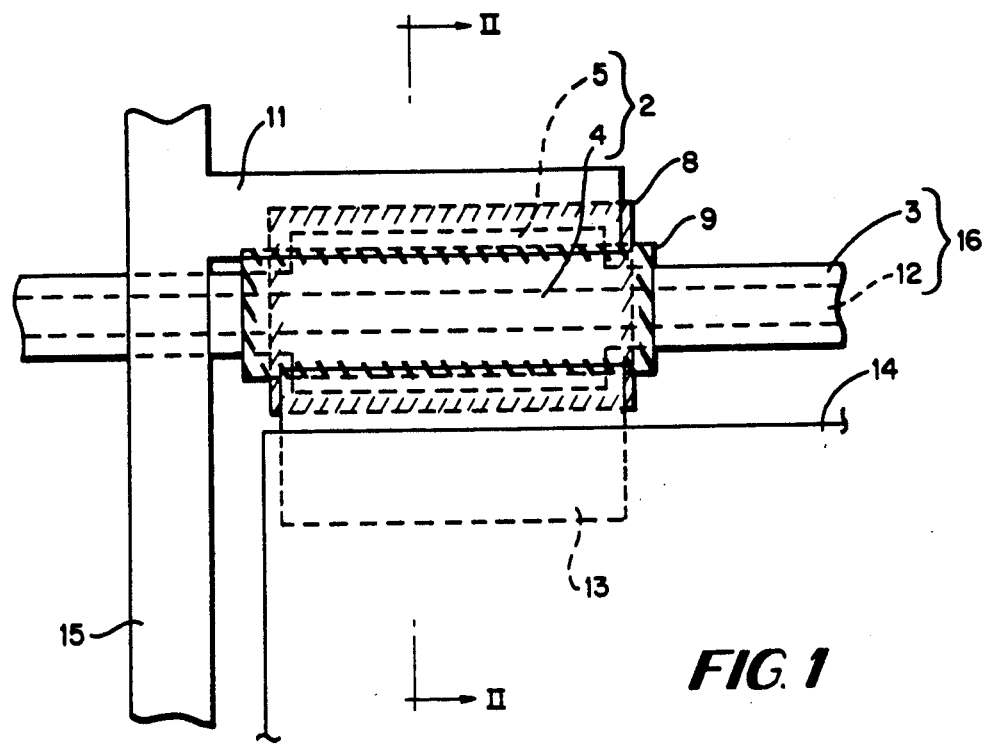
FIG. 1 is a plan view showing a transistor array device according to the present invention.
Figure 2:
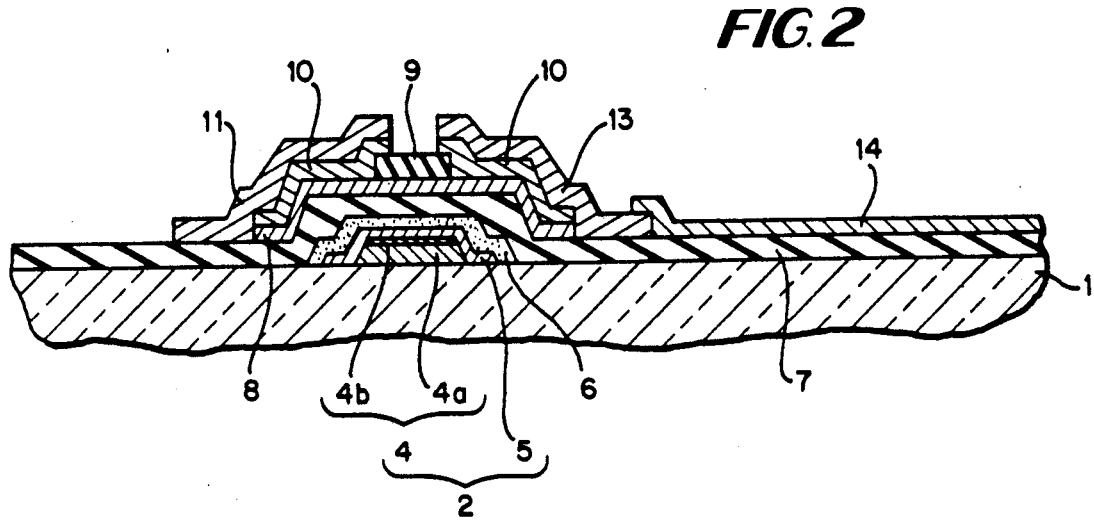
FIG. 2 is a cross-sectional view taken along the line II—II in FIG. 1.

Referring to FIGS. 1, 2 and 3A–3F, and Al layer 4a (1,000 Å thick), and an Mo layer 4b (500 Å thick) were consecutively deposited on a galss substrate 1 by a spattering method. A desired shape of etching mask was formed on the Mo layer 4b with a photo resist film, and etching was carried out in accordance with the etching mask so that an inner gate wiring 12 was formed as shown in FIG. 1. A part of the inner gate wiring 12 is used as an inner gate electrode 4. Each of the inner gate wiring 12 and the inner gate electrode 4 has a width of 15 μm.

Figure 3A:
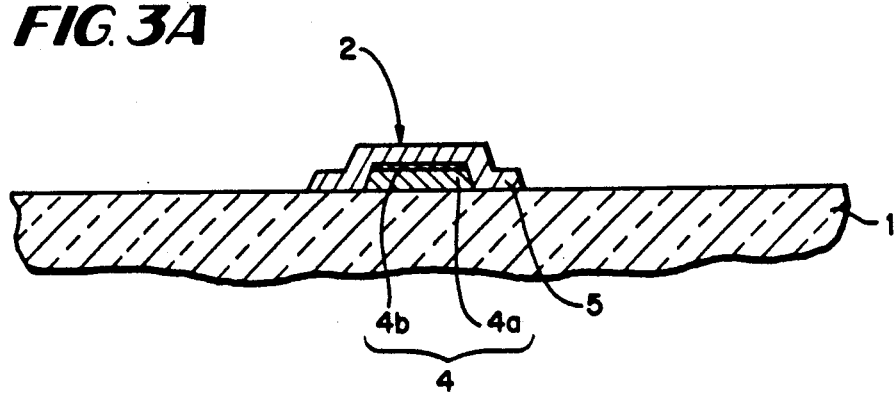
FIGS. 3A to 3F are cross-sectional views explaining the steps of constructing the transistor array device of FIG. 1.

Subsequently, a Ta layer (3,000 Å thick) was deposited on the Mo layer 4b, and an outer gate wiring 3 and an outer gate electrode 5 were formed in pattern, each of which had a greater width by 1 μm or more than those of the inner tape wiring 12 and the inner gate electrode 4 (FIG. 3A). A rim portion of the outer gate wiring 3 is used as the outer gate electrode 5. In the illustrated example the inner gate wiring 12 and the outer gate wiring 3 constitute the gate wiring 16. Likewise, inner gate electrode 4 and the outer gate electrode 5 constitute the gate electrode 2.

Figure 3B:
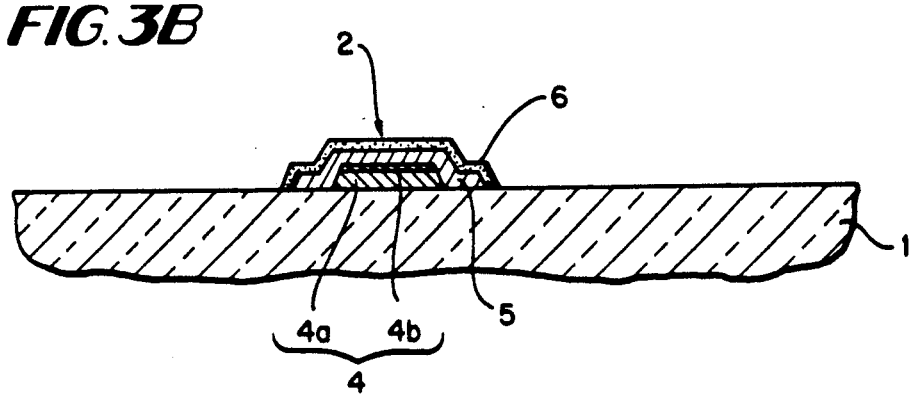

The top surfaces of the outer gate electrode 5 and the outer gate wiring 3 were anodized so as to form an anodized film 6 consisting of $Ta_2O_5$ and functioning as a gate insulating film as shown in FIG. 3B. Since the $Ta_2O_5$ film is resistant to etching, it protects the outer gate electrode 5, the outer gate wiring 3, the inner gate wiring 12 and the inner gate electrode 4 against an etchant used in a later etching for forming TFTs.

Figure 3C:
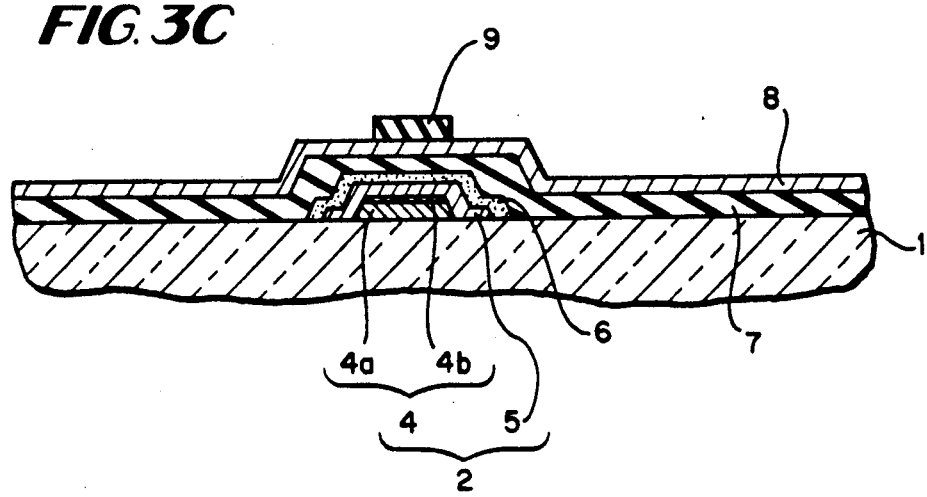

The entire surface of the glass substrate 1 was covered with a gate insulating film 7 (4,000 Å thick) consisting of SiNx by a plasma CVD method. the gate insulating film 7 is covered with an a-Si(i) layer (300 Å thick) which later becomes a semiconductor layer 8, and a SiNx layer (2,000 Å thick) which later becomes an insulating layer 9 in this order. The SiNx layer was formed in a desired pattern, and the insulating layer 9 was formed only above the gate electrode 2 (FIG. 3C).

Figure 3D:
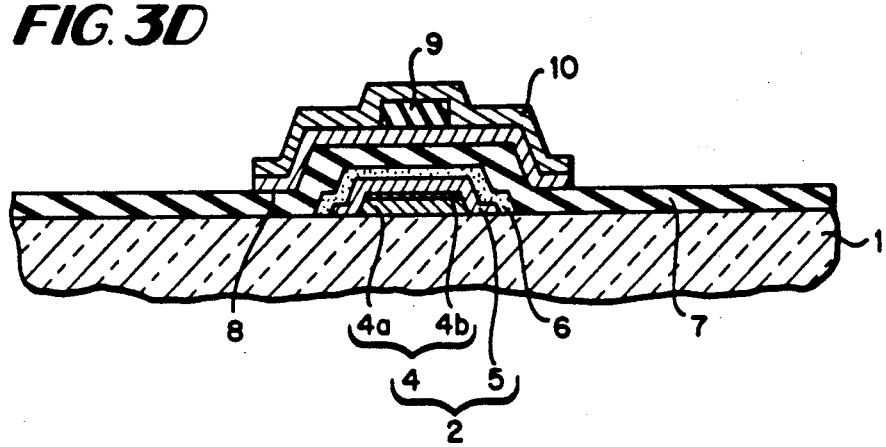

The glass substrate 1 and the insulating layer 9 thereon was covered with an a-Si(n+) layer (1,000 Å thick) by a plasma CVD method. Then, the a-Si(i) layer and a-Si(n+) layer were formed in pattern so that semiconductor layer 8 and the contact layer 10 were formed (FIG. 3D). The contact layer 10 functions as an ohmic contact among the semiconductor layer 8, the source electrode 11 and the drain electrode 13. At this stage, the contact layer 10 is continuous on the insulating layer 9.

Figure 3E:
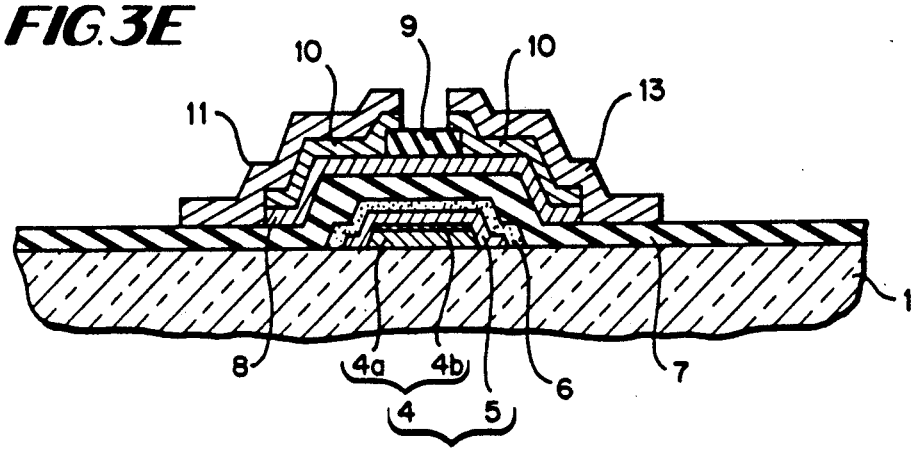

The entire surface of this glass substrate 1 was covered with a Ti layer (3000 Å thick) which was formed in pattern by etching to form the source electrode 11 and the drain electrode 13. At this stage, the contact layer 10 on the insulating layer 9 was removed by etching, thereby separating into two portions below the source electrode 11 and the drain electrode 13 (FIG. 3E). The source wiring 15 crossing the gate wiring 16 was formed at this time. In this way, the TFT array device is obtained.

Figure 3F:
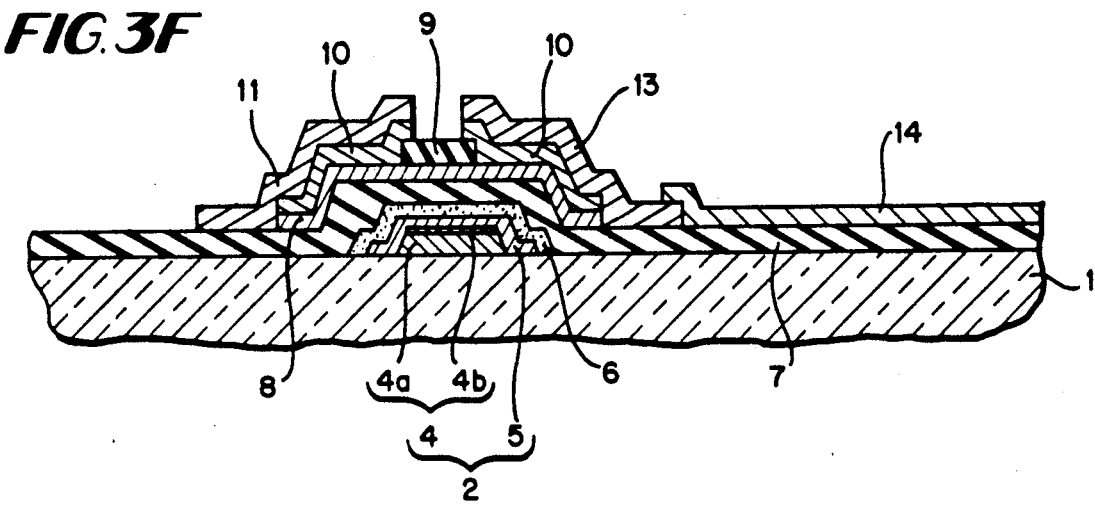
Figure 4:
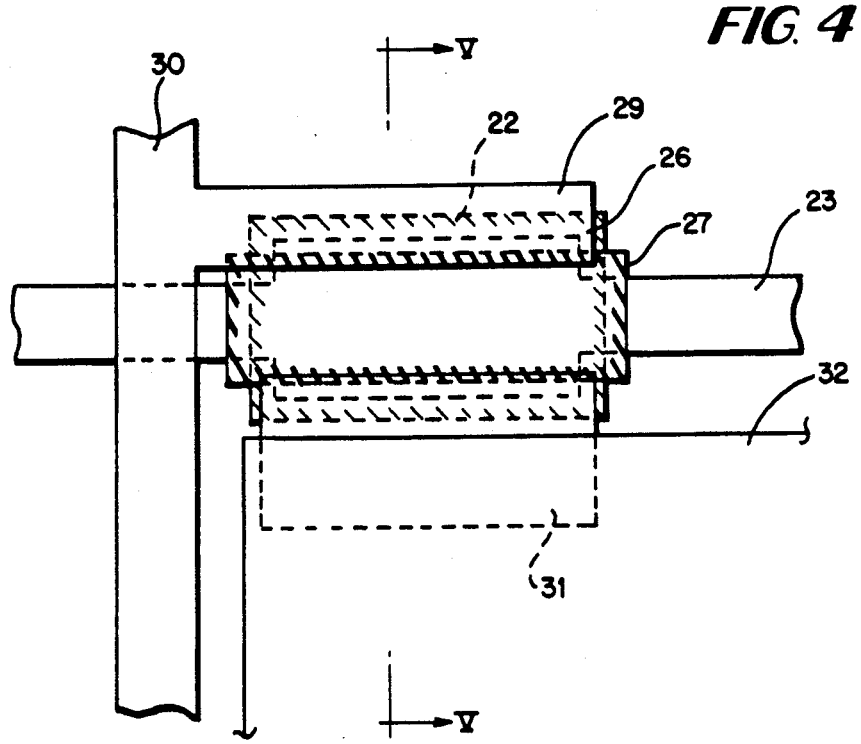
FIG. 4 is a plan view showing a conventional TFT semiconductor array device.
Figure 5:
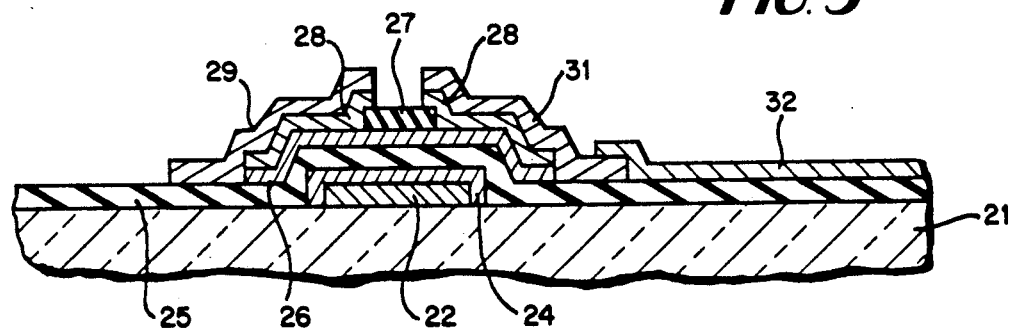
FIG. 5 is a cross-sectional view taken along the line V—V line in FIG. 4.
Figure 6:
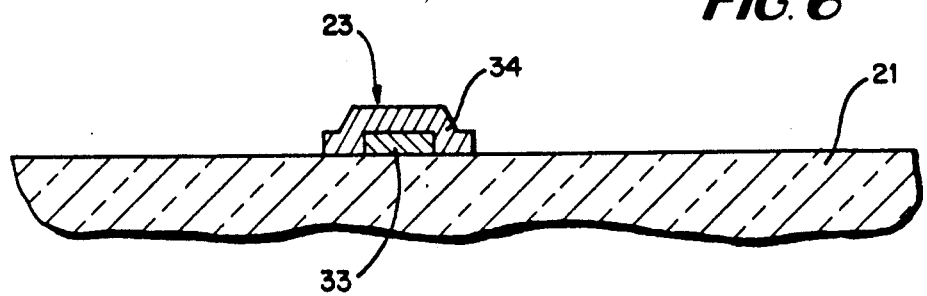
FIG. 6 is a cross-sectional view showing an modified example of the gate wiring.

Subsequently, the entire surface of the glass substrate 1 was covered with an ITO film by spattering. The ITO film was formed in a desired pattern, thereby forming a picture element electrode 14 (FIG. 3F). In this way an active matrix substrate is formed.

The TFT array device of the present invention has a gate wiring 16 which includes an inner gate wiring 12 having an Al layer 4a and an Mo layer 4b overlapped in this order, and an outer gate wiring 3 of Ta covering the inner gate wiring 12. Because of the small specific resistance of the gate wiring 16 which is composed of the Al layer 4a and the Mo layer 4b, the picture elements which are represented by the picture element electrode 14 connected to the same gate wiring 16 are prevented from a detrimental brightness gradient.

Since the inner gate wiring 12 is constituted with a dual layer having the Al layer 4a and the Mo layer 4b overlapped, the Al layer 4a is protected from hillocks and voids. In addition, since the etching speed at which the Mo layer 4b forms the inner gate wiring 12 and the inner gate electrode 4 is faster than that by the Al layer 4a with respect to the etchant, the cross-section of the inner gate wiring 12 becomes tapered by its width becoming smaller progressively from the glass substrate 1.

Since the outer gate wiring 3 is wider than the inner gate wiring 12, the tapered inner gate wiring 12 is completely covered with the outer gate wiring 3. Owing to the coverage the inner gate wiring 12 is kept safe from an etching liquid. After the outer gate wiring 3 is formed and its surface is covered with the anodized film 6, the gate wiring 16 has a tapered side, thereby ensuring that the source wirings 15 crossing the gate wiring 16 are kept safe from breakage.

As described above, the gate electrode 2 is protected from breakage because of its smooth side surface and smooth top surface like the gate wiring 16. A TFT layer 8 overlaid thereon through a gate insulating film is also protected from detrimental breakage. Thus, the TFT layer 8 can be made thin without trading off the effectiveness. Thin TFT semiconductor layers 8 increase resistance during the gate-off period. A large gate-off resistance maintains the potential of the picture element electrode 14 at a high level until a subsequent scanning signal is input.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A thin film transistor array device having a gate wiring on an insulating substrate, the gate wiring comprising an inner gate wiring having a first metal layer formed on the insulating substrate and a second metal layer whose etching speed is faster than that of the first metal layer, the first metal layer and the second metal layer being overlapped so as to constitute a dual structure, and an outer gate wiring covering the inner gate wiring.

2. A thin film transistor array device according to claim 1, wherein the inner gate wiring has a smaller specific resistance than that of the outer gate wiring.

3. A thin film transistor array device according to claim 1 or 2, wherein the outer gate wiring is covered with an anodized film.

* * * * *